United States Patent
Yamada et al.

(10) Patent No.: US 6,416,820 B1
(45) Date of Patent: Jul. 9, 2002

(54) METHOD FOR FORMING CARBONACEOUS HARD FILM

(75) Inventors: Isao Yamada, Hyogo; Jiro Matsuo; Teruyuki Kitagawa, both of Kyoto, all of (JP); Allen Kirkpatrick, Lexington, MA (US)

(73) Assignee: Epion Corporation, Billerica, MA (US)

(*) Notice: Subject to any disclaimer, the term of this patent is extended or adjusted under 35 U.S.C. 154(b) by 0 days.

(21) Appl. No.: 09/443,995

(22) Filed: Nov. 19, 1999

(51) Int. Cl.$^7$ .............................................. C23C 14/06
(52) U.S. Cl. .................... 427/530; 427/533; 427/249.3; 427/249.6
(58) Field of Search ................................. 427/530, 533, 427/562, 563, 577, 249.3, 249.6

(56) References Cited

U.S. PATENT DOCUMENTS

| | | |
|---|---|---|
| 5,209,916 A | 5/1993 | Gruen |
| 5,328,676 A | 7/1994 | Gruen |
| 5,370,855 A | 12/1994 | Gruen |
| 5,391,407 A | 2/1995 | Dearnaley |
| 5,393,572 A | 2/1995 | Dearnaley |
| 5,459,326 A | 10/1995 | Yamada |
| 5,462,776 A | 10/1995 | Gruen |
| 5,512,330 A | 4/1996 | Dearnaley |
| 5,561,326 A | 10/1996 | Ito et al. |
| 5,605,714 A | 2/1997 | Dearnaley et al. |
| 5,620,512 A | 4/1997 | Gruen et al. |
| 5,624,718 A | 4/1997 | Dearnaley |
| 5,725,573 A | 3/1998 | Dearnaley et al. |
| 5,731,045 A | 3/1998 | Dearnaley et al. |
| 5,772,760 A | 6/1998 | Gruen et al. |
| 5,780,119 A | 7/1998 | Dearnaley et al. |
| 5,814,194 A | * 9/1998 | Deguchi et al. ......... 427/249.8 |
| 5,849,079 A | 12/1998 | Gruen et al. |
| 5,990,493 A | * 11/1999 | Gardner et al. ................ 257/77 |

FOREIGN PATENT DOCUMENTS

| | | |
|---|---|---|
| EP | 0 280 198 A | 8/1988 |
| EP | 0 724 023 A1 | 7/1996 |
| JP | 06-184738 A | 7/1994 |
| JP | 06-275545 | 9/1994 |
| JP | 08-127867 | 5/1996 |
| JP | 10-265944 | 10/1998 |
| WO | WO 88/02790 | 4/1988 |
| WO | WO 01/36704 A2 | 5/2001 |

OTHER PUBLICATIONS

Preparation of $C_{60}$ single crystalline thin film by ionized cluster beam deposition and ion implantation into single crystalline $C_{60}$ thin film by S. Isoda et al., Central Research Laboratory Nucl. Instr and Method in Phys. Res. B 112 (1996) pp. 94–98.

Surface modification with gas cluster ion beams by I. Yamada et al., Nuclear Instruments and Methods in Physics Research B 79 (1993) pp. 223–226.

Low–energy cluster ion beam modification of surfaces by Isao Yamada Nucl. Iinstr. & Meth. in Phys. Res., B148, 1–11 (1993).

(List continued on next page.)

Primary Examiner—Bret Chen
(74) Attorney, Agent, or Firm—Perkins, Smith & Cohen, LLP; Jerry Cohen; Michelle J. Burke

(57) ABSTRACT

A method for enabling the formation of a carbonaceous hard film having a high hardness, strong adherence to the substrate, a wide range of substrate compatibility, and structural stability, which can be formed at room temperature and may cover a large area. The method includes vapor depositing a hard film of a carbonaceous material onto a substrate under vacuum by depositing a vaporized, hydrogen free carbonaceous material, which may be ionized or non-ionized, onto the substrate surface while irradiating the carbonaceous material with gas cluster ions, generated by ionizing gas clusters to form the film.

12 Claims, 3 Drawing Sheets

OTHER PUBLICATIONS

Gas Cluster Ion Beam Processing for ULSI Fabrication by I. Yamada and J. Matsuo; Mat. Res. Soc. Symp. Proc. vol. 427, (1996) pp. 265–276.

Physical and tribological properties of diamond films grown in argoncarbon plasmas by C. Zuiker et al., Materials Science, Chemistry and Energy Technology Divisions, Argonne National Laboratory, Argonne, IL 60439 Thin Solid Films 270 (1995) pp. 154–159.

Production of diamondlike carbon films through random compact cluster stacking by V. Paillard et al., Physicha Review B, vol. 49, No. 16, Apr. 15, 1994 pp. 11433–11439.

Role of ion energy in determination of teh $sp^3$ fraction of ion beam deposited carbon films by E. Grossman et al., Appl. Phys. Lett. vol. 68(9), p. 1214, (1996).

Toyoda N. et al.; "Surface treatment of diamond films with Ar and 02 cluster ion beams"; Nuclear Instruments & Methods in Physics Research, Section—B; vol. 148, No. 1–4, Jan. 2, 1999, pp. 639–644; North–Holland Publishing Company, Amsterdam.

Yoshida A., et al.; "Atomic level smoothing of CVD diamond films by gas cluster ion beam etching"; Nuclear Instruments & Methods in Physics Research, Section—B: vol. 112, No. 1, May 1, 1996; pp. 248–251; North–Holland Publishing Company, Amsterdam.

Xia–Ming He et al.; "Structural Characterization and Properties Enhancement of Diamond–Like Carbon Films Synthesized Under Low Energy $Ne^+$ bombardment"; Diamond and Related Materials, vol. 3, No. 11/12, Nov. 1, 1994, pp. 1319–1324; Elsevier Science Publishers, Amsterdam, NL.

Hirvonen J –P, et al.: "Characterization and unlubricated sliding of ion–beam–deposited hydrogen–free diamond–like carbon films"; vol. 141, 1990, pp. 45–58, Wear, CH, Lausanne.

* cited by examiner

METHOD FOR FORMING CARBONACEOUS HARD FILM

BACKGROUND OF THE INVENTION

The invention is directed to a method and apparatus for forming a carbonaceous hard film and a device therefor. In particular, the invention is directed to a method and apparatus for forming a novel carbonaceous hard film having a dramatic surface-improving effect, which is useful in tools and moving parts where a high hardness, wear resistance, and reduced friction are required, and in precision electronic instrument parts and the like.

In recent years, higher hardness and higher functionality are being required more and more from hard coatings for industrial use. In these circumstances, hard carbonaceous coatings, represented by diamond-like carbon films, have drawn attention as a material satisfying the more rigorous demands of a new era. Such hard carbonaceous coatings have been subject to attempts at vapor phase film deposition by various methods, foremost among them chemical vapor deposition (CVD), but there are various problems in the path to practical use, and the range of application has been limited so far.

For example, in the most successful instances, a maximum level of 3,000 kg/mm$^2$ Vickers hardness has been attained in a hard carbonaceous film through plasma assisted CVD methods, but a problem exists in that 3,000 kg/mm$^2$ has been an actual limit. Adhesion characteristics and the substrate temperature during film formation also present problems to be solved with regard to conventional hard carbonaceous films resulting from vapor phase film deposition.

In hard carbonaceous films formed using plasma enhanced CVD processes, adhesion characteristics to various steel and other metallic substrate materials, primarily tools, are in reality poor, and implementation into practical applications has been problematic. The reason is that the coefficient of thermal expansion of a hard carbonaceous film is extremely low (0.80×10$^{-6}$/K). Thus, when a film is formed on a substrate material with a large coefficient, such as stainless steel (13.8×10$^{-6}$/K in primary material, iron), it has not been possible to avoid reaching relatively high temperatures in the substrate material during formation of the hard carbonaceous film. When the substrate material temperature cools down from the high temperature reached during film-formation to ambient temperature after film-formation, stress develops between the film and the substrate material, and consequently the film peels off.

Conventional methods investigated for improving the poor adhesion of a film include forming an intermediate layer between the substrate material and the film (a silicon compound or the like), and roughening of the substrate material surface. However, while the first method initially appears to improve adhesion between the hard carbonaceous film and the intermediate layer, in actual application in tools and the like, adhesion has still been insufficient, and the film peels off. It has also not been possible to obtain an intermediate layer having a sufficient hardness to allow placement under a high-hardness carbonaceous film. The second method, like the first method, does not obtain adequate adhesion strength in actual use.

During film-formation, a substrate heating temperature of at least 200° C. or more has been required to obtain a high-hardness carbonaceous film. Thus, it has not been practical to apply hard carbonaceous films to substrate materials that experience deformation or deterioration at high temperatures, e.g., substrate materials having a low melting point or that become annealed and lose their hardness within this range of temperatures.

In various conventional CVD processes, gas mixtures of hydrogen and methane, or other hydrocarbon gases, have been used as the source for film formation material and the incorporation of hydrogen into the carbonaceous film was deliberate. However, as noted above, the hardness thus obtained has been merely 3,000 kg/mm$^2$ Vickers hardness at maximum. In terms of heat-resistance, in hard carbonaceous films containing hydrogen, graphitization begins at 350° C., whereas in a film not containing hydrogen, graphitization does not begin unless the temperature is 500° C. or higher. The onset of graphitization causes a decline in hardness and a degradation of characteristics.

With hydrogen, the danger of ignition is also extremely high, and use of methane gas or other such hydrocarbon gas at the same time presents a flammability hazard.

Methods for forming a hard carbonaceous film not containing hydrogen include sputtering methods, electron beam deposition methods, and direct ion beam methods, but in these methods, hardness, wear resistance, and other such characteristics have been found to be inadequate, and for reasons including the narrow range of parameters in which the film-forming process operates an article adequate for practical use cannot presently be obtained.

CVD methods and other such plasma processes also entail problems in that generation of films having a uniform, large surface area has been difficult. When plasma is generated adjacent to an insulating hard carbonaceous film, once the plasma has been extinguished, growth does not again appear in the same location even if the plasma is regenerated, thus posing a major problem to the creation of a large, uniform surface area film.

SUMMARY OF THE INVENTION

Accordingly, the invention provides a method and apparatus for forming a novel carbonaceous hard film, which has a high hardness surpassing the hardness level previously deemed a conventional limit, is superior in adherence to a substrate material, obviates effects resulting from substrate temperature, and is also superior in potential for creation of a large surface area.

The invention provides a method and apparatus for forming a carbonaceous hard film by irradiation with gas cluster ions during or following the deposition of a layer of carbonaceous material from vapor which may, or not, be partially ionized, wherein said method is a method for vapor phase film deposition of a carbonaceous hard film on a substrate material under a vacuum-reduced pressure. The vaporized carbonaceous material, which may be ionized or non-ionized, is deposited onto a substrate surface. Gas clusters made up of atomic or molecular aggregate of a material, which is gaseous at ambient temperature and pressure, are ionized, accelerated and irradiated onto the surface containing the layer of carbonaceous material.

The invention also provides a formation method, wherein the carbonaceous material is one or more of a fullerene, a carbon nanotube, graphite, amorphous carbon, or a carbene not containing hydrogen. The formation method is such that the atoms or molecules comprising the gas clusters are comprised of one or more of a rare gas, oxygen, a carbon oxide, nitrogen, a nitride, a halogen, or a halide. The Vickers hardness of the carbonaceous hard film is more than 4,000 kg/mm$^2$ and the coefficient of friction is 0.15 or less. In addition, the carbonaceous hard film does not contain hydrogen.

The invention provides an apparatus for forming a carbonaceous hard film on a substrate through irradiation with gas cluster ions, wherein the apparatus is equipped with a gas cluster beam generation means, a gas cluster ionization means, ionized gas cluster acceleration means, means for generating vaporized particles of carbonaceous material, vaporized particles ionization means, means for acceleration of the vaporized and ionized particles of carbonaceous materials, and a film formation unit therefore, which are disposed as necessary, and vacuum exhaust means. The gas cluster ionization and acceleration units and the carbonaceous material vaporized particle product, or the product of ionization and acceleration units added thereto, are directed towards a substrate surface disposed in the film formation unit such that individual gas cluster ions and ionized or non-ionized carbonaceous material vaporized particles are irradiated onto the substrate.

The invention also provides a carbonaceous hard film deposited on a substrate material from vapor phase, wherein the Vickers harness is more than 4,000 kg/mm$^2$ and the coefficient of friction is 0.15 or less, and the invention offers a carbonaceous hard film not containing hydrogen.

DETAILED DESCRIPTION OF THE INVENTION

Figure 1:
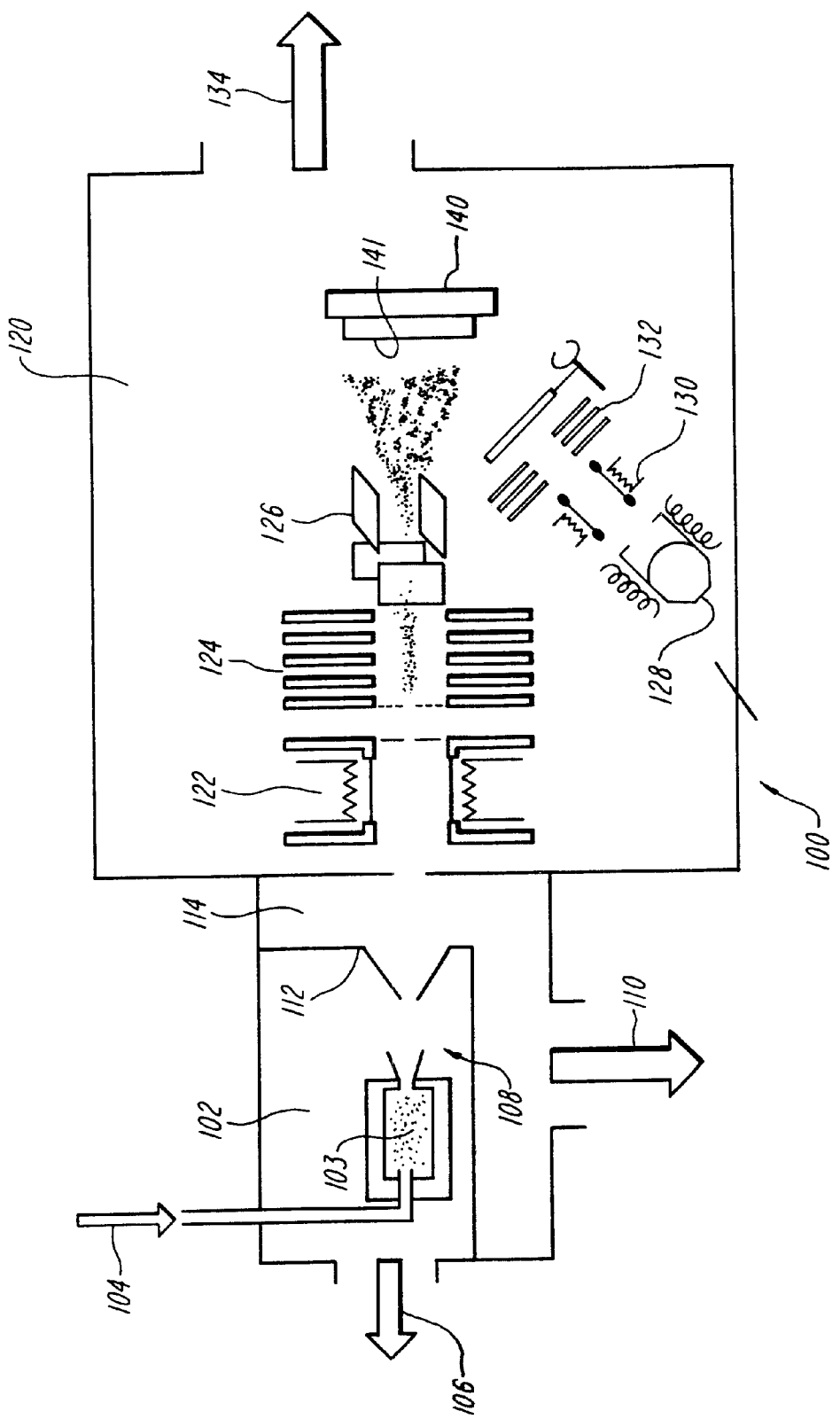
FIG. 1 is a schematic block diagram of a film forming apparatus that utilizes a gas cluster ion beam in accordance with the invention.
Figure 2A:
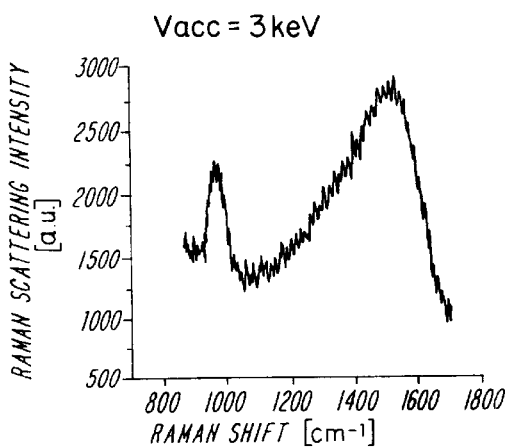
FIGS. 2A–2D are graphs showing the change in the Raman spectrum when the cluster ion accelerating energy is varied.
Figure 2B:
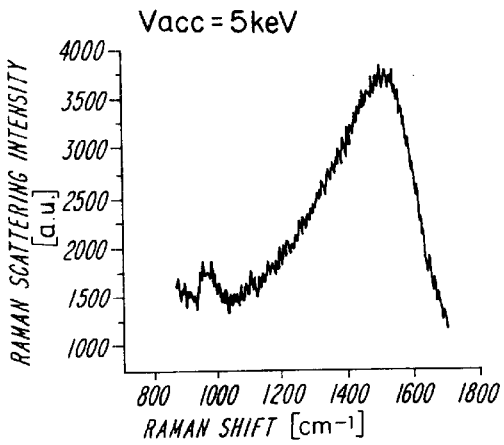
Figure 2C:
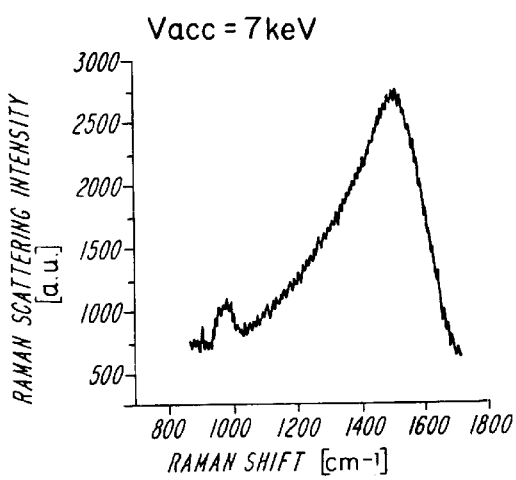
Figure 2D:
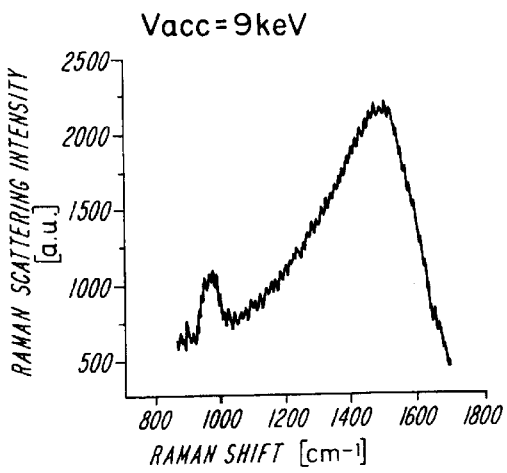

A method of forming a carbonaceous hard film according to the invention is structured according to a method characterized by vapor phase film formation by gas cluster ion beam assisted deposition. Specifically, a method of vapor-phase film formation of a carbonaceous hard film on a substrate material under a vacuum-reduced pressure is described. When a vaporized carbonaceous material is deposited onto a substrate material surface with or without ionization, a gas cluster comprising an aggregate of atoms or molecules of a material, which is gaseous at ambient temperature and pressure, is ionized, and film formation is carried out by irradiating the gas cluster ions onto said layer of the carbonaceous vapor deposited on the surface of a substrate material.

In accordance with the invention, the carbonaceous material may be of various types excluding diamond, and examples include one or more of a fullerene, a carbon nanotube, graphite, amorphous carbon, or a carbene not containing hydrogen. These several carbonaceous materials are appropriate in that do not contain hydrogen other than as a possible impurity. Among these, fullerenes and carbon nanotubes, or homologues thereof, have drawn recent attention from the perspective of novel carbon material technology and are cited as ideal starting materials.

These carbonaceous materials are vaporized and deposited onto a substrate surface either directly or after ionization. The means for vaporization may be an appropriate process such as sputtering, laser ablation, ion or electron beam, or crucible heating. In the case of ionized particles, these may be accelerated and deposited on a substrate surface. The atoms or molecules comprising a gas cluster are a gas under conditions of ambient temperature and ambient pressure. Examples include one or more of argon, helium, neon, and other rare gases; oxygen; $CO_2$ and other carbon oxides; nitrogen; nitrides; halogens; and $SF_6$ and other halides.

The number of atoms (molecules) comprising a cluster or cluster ion can be controlled by controlling the formation conditions of the gas cluster, and in the method of the invention, the number thereof is not limited but can be made, for example, 10–10,000.

The gas clusters, made up of aggregates comprising a number of atoms (molecules) between 10–10,000 (which can be predetermined), are ionized by electron bombardment, for example, and endowed with energy by acceleration to form a cluster ion beam which is then irradiated.

Conditions in the film formation of a carbonaceous hard film also include the degree of vacuum pressure reduction during film formation, the substrate material temperature during film formation, the ratio of the number of atoms or molecules in the vaporized particles of the carbonaceous material or the ionized particles thereof to the number of gas cluster ions, and the gas cluster ion accelerating voltage. These conditions can also be set as appropriate considering such factors as the type of carbonaceous material or the characteristics of the carbonaceous hard film, and the rate of film formation.

For example, a quantity of 1–10 gas cluster ions per 1–5,000 molecules comprising the carbonaceous material is considered. There is also no particular limitation with respect to the cluster ion accelerating voltage, and the voltage is set within a range forming a carbonaceous film of desirable quality. For example, the cluster ion accelerating voltage may be set in the range of 1 KeV–100 KeV.

Unlike the plasma CVD methods conventionally employed, there is absolutely no need to heat the substrate in the method of the invention. Rather, a carbonaceous hard film can be formed on a substrate held at room temperature without heating. Of course, it is also acceptable to perform heating if desired, within limits that do not interfere with the method.

Unlike conventional plasma film forming methods, there is negligible increase in the temperature of the substrate during the process of forming the film in the method herein described. For this reason, the method can be utilized without any particular restrictions on the type of substrate employed. Moreover, the problem that has been encountered in the conventional art, wherein there is a substantial increase in the temperature of the substrate during film formation, does not occur with the present method. In addition, pre-treatments such as the provision of an intermediate layer or roughening of the substrate surface are not required in the method of the invention.

In the method for forming a carbonaceous hard film in accordance with the invention, if the Ar atoms which form an Ar cluster ion are present in the amount of 1,000 atom/ion, for example, and an accelerating energy of 5 keV is applied to this gas cluster ion, then the energy per atom is the value obtained when the total energy is divided by the number of atoms forming the cluster. In this case, this energy is 5 eV/atom. Accordingly, since this is an equivalently low energy ion beam, it is possible to form a high quality carbonaceous hard film in which there is minimal radiation damage such as voids.

Moreover, in the case of a gas cluster ion, a localized, instantaneous high-temperature, high-pressure state can be achieved on the surface during multiple impacts with the surface of the substrate. Thus, it becomes possible to approach the high-temperature, high-pressure state required for diamond synthesis. As a result, a carbonaceous hard film can be obtained which has high hardness, is resistant to friction and wear, and which includes many $sp^3$ diamond bonds which could not be achieved with the conventional methods for forming films.

FIG. 1 is a schematic block diagram of a film forming apparatus 100 that utilizes a gas cluster ion beam in accordance with the invention. The apparatus 100 includes a gas cluster generating chamber 102 and a film formation chamber 120. The gas cluster generating chamber includes a source of gas 104, a nozzle 108, and a vacuum pump 106. A skirmer 112 separates un-clustered gas from gas clusters prior to their entry into a differential pumping chamber 114 that includes a vacuum pump 110.

The film formation chamber includes a first ionizer 122, a first accelerator 124, and a deflection system 126. The chamber 120 also includes a second ionizer 130 and an associated crucible 128, and a second accelerator 132. A vacuum pump 134 serves to evacuate the chamber in which a substrate 141 is positioned by a substrate holder 140.

In an exemplary embodiment, the gas clusters are generated and radiated as follows. A high-pressure source gas 104 is expanded from the nozzle 108 of the gas cluster generating element 103 into the vacuum in the gas cluster generating chamber 102. The energy of the source gas atoms is converted into translational motion energy, while at the same time reducing their thermal energy by adiabatic expansion. The source gas atoms or molecules, which super-cooled due to the loss of thermal energy, nucleate the atoms or molecules to form gas clusters. These neutral clusters which have formed are passed through a skimmer 112 to the differential pumping chamber 114 and eventually to the film formation chamber 120. After being ionized by ionizer 122, the gas cluster ions are accelerated by accelerator 124 towards the substrate 141. Deflection system 126 scans the gas cluster ion beam over the surface of the substrate 141.

In the example shown in FIG. 1, a carbonaceous material is vaporized by heating it within the crucible 128, which is the element for generating the vaporized particles of the carbonaceous material. Thereafter, as needed, the vaporized particles of carbonaceous material may be partially ionized by ionizer 130 and the ionized particles are further accelerated by accelerator 132. The vaporized carbonaceous particles, ionized or non-ionized, are deposited on the substrate surface. During film formation, the gas cluster ion beam bombards the substrate material. Optionally, the deposited film may also be removed from the device in which it was produced, to be irradiated by the cluster ion beam in a separate suitable device.

In accordance with the invention, a carbonaceous hard film can be provided in which (1) it is a carbonaceous hard film deposited in vapor phase onto a substrate, (2) the Vickers hardness is higher than 4,000 kg/mm$^2$, (3) the friction coefficient is 0.15 or less, and (4) the carbonaceous hard film of the invention does not contain hydrogen atoms in the hard film.

The term "carbonaceous hard film" as employed herein in reference to the invention means that the primary film component is carbon, and that the film material is composed only of carbon, with the exception of atoms or molecules which become unintentionally mixed in as impurities from the starting materials for vapor phase film formation or as otherwise unintended contaminants.

The carbonaceous hard film of the invention, formed in vapor phase as described above, has not been known nor concretely offered previously. For example, specifically, by employing the invention, it is possible to provide a material having a Vickers hardness of in excess of 4,000 kg/mm$^2$ and a friction coefficient of 0.15 or less. The thickness of the carbonaceous hard film is not particularly restricted, but may be within the range of 1~5 μm, for example.

Further explanation in greater detail will now be made using the following examples.

Carbonaceous hard films were formed using a method in which a carbonaceous material was vapor deposited, while employing gas cluster ions, on each of a silicon, SUS 304, Cr, Ni, and organic substrate.

A pure carbon fullerene (mainly $C_{60}$) was used here as the carbonaceous material, with argon employed as the cluster source gas. As shown in FIG. 1, by heating the crucible, the fullerene was vaporized and vapor deposited onto the substrate. The argon cluster ions were ionized and accelerated to 1~10 keV, and then bombarded onto the room temperature substrate.

By performing vapor deposition and radiation at a proportion of 1~10 argon cluster ions per 1~5,000 fullerene molecules that reach the substrate, it was possible to form a solid carbonaceous hard film on the various substrates noted above within the wide ion accelerating energy range of 3~9 keV. The Raman spectra of carbonaceous hard films formed following radiation in which the argon cluster ion accelerating energy was varied among 3, 5, 7 and 9 keV are shown respectively in the graphs of FIGS. 2A–2D. Broad Raman spectra in the range of 1200 cm$^{-1}$~1600 cm$^{-1}$ which verified the carbonaceous hard film could be obtained.

Figure 3:
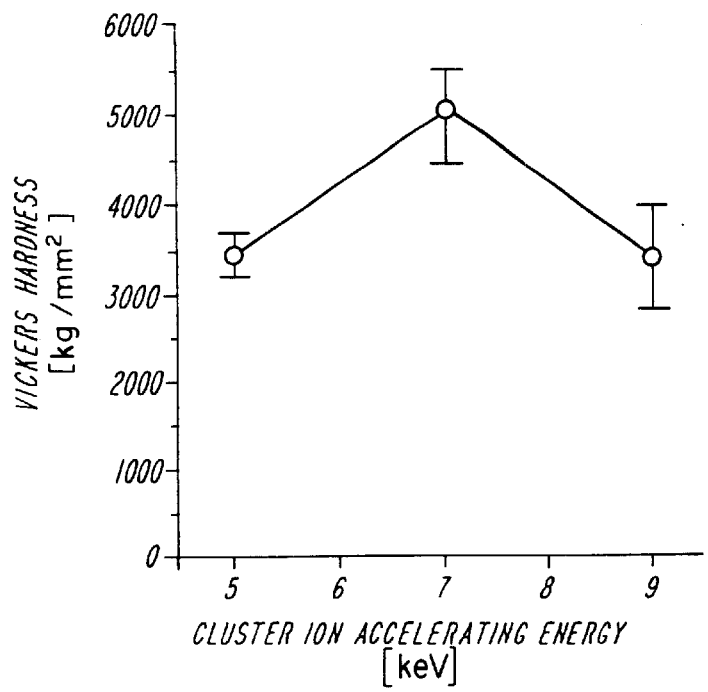
FIG. 3 is a graph showing the change in the Vickers hardness.
Figure 4:
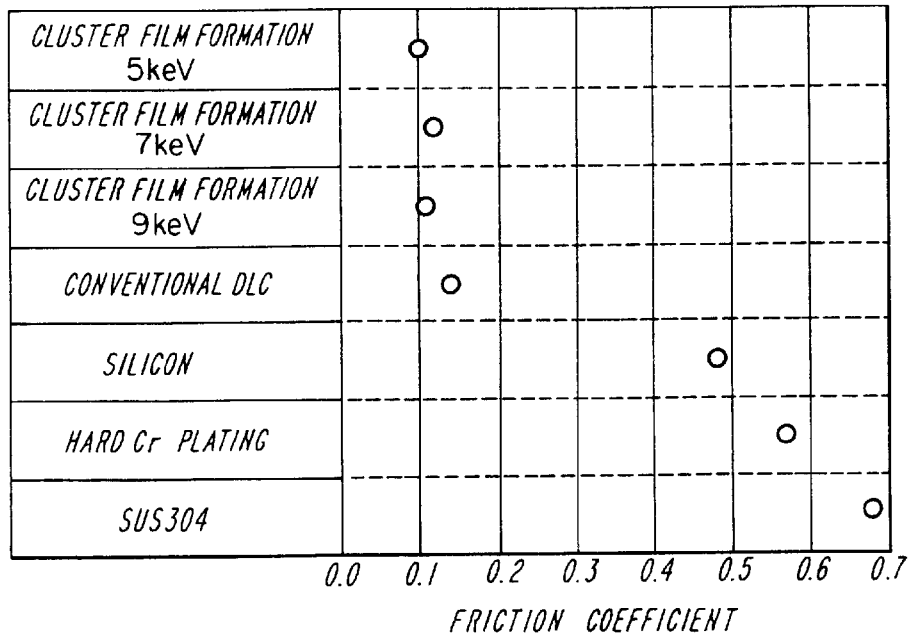
FIG. 4 is a graph showing the results of measurements of the friction coefficient.

The Vickers hardness of carbonaceous hard films (film thickness: 2 μm) formed following irradiation in which the argon cluster accelerating energy was varied among 5, 7, and 9 keV are shown in the graph of FIG. 3. The highest hardness was obtained at an argon cluster ion accelerating energy of 7 keV, this hardness being approximately 5,000 kg/mm$^2$. The results of measurements of the friction coefficient are shown in the graph of FIG. 4. It was found that the friction coefficient was extremely small, at a value of 0.1. In addition, a carbonaceous hard film that was sufficiently adhered to the substrate could be obtained for all the substrates without carrying out a pre-treatment such as providing an intermediate layer.

In contrast, in the CVD method that is currently employed in industry, it is not possible to adhere the hard carbonaceous film without performing a pre-treatment to the metal substrate. Accordingly, it was understood that the film obtained using the method of the invention could not be achieved through conventional methods for forming a hard carbonaceous film.

In addition, in the case of an organic substrate, it was also possible to form a carbonaceous hard film without any accompanying change in the character or shape of the substrate, and the substrate itself did not reach a high temperature.

As explained in detail heretofore, the invention provides a formation method in which a carbonaceous hard film can be directly deposited onto a substrate, irrespective of whether that substrate is a metal or non-metal, without performing a pretreatment such as provision of an intermediate layer. The carbonaceous hard film provided by the invention may be applied to processes which require high hardness or low friction or both, or may be used as a high quality protective film for non-lubricated sliding parts in the various types of machinery which have been put into operation in clean environments in recent years, as well as optical lenses and filters. In addition, the carbonaceous hard film of the invention may also be utilized as a surface material for a variety of metal-molded industrial equipment parts, such as the various rollers for precision molding, which must be reflective, shock resistant and resistant to chemicals, as well as have a smooth surface and be wear resistant. Accordingly, the carbonaceous hard film of the invention can be utilized as a surface improving film for various parts in any industrial field. As a result of the present invention, it is possible to provide a carbonaceous hard film that has a Vickers hardness in excess of 4,000 kg/mm$^2$, and offers superior resistance to friction and wear, and excellent chemical stability.

Specifically, the invention provides the following effects. The film can be formed at room temperature when forming the film using a gas cluster ion beam. Accordingly, it was possible to form a carbonaceous hard film of sufficient adhesion on a metal substrate, such as stainless steel, in which there is a large difference in the coefficient of thermal expansion between the substrate material and the carbonaceous hard film. Furthermore, it was possible to form a film onto an organic substrate having a low thermal deformation temperature, something that had been problematic to achieve with the conventional technology.

In the method of the invention, there is absolutely no need to employ the hydrogen that is used in many conventional CVD processes. As a result, a carbonaceous hard film is formed which, as compared to the hard carbonaceous films formed using CVD processes and the like, does not contain hydrogen. Accordingly, none of the problems observed in hard carbonaceous films containing hydrogen occur in the described method, so that, as a result, it is possible to form a carbonaceous hard film that has superior thermal stability.

By applying an electric field to a gas cluster ion beam following acceleration, scanning thereof becomes possible by means that are well known in the ion beam art. By such scanning it becomes easy to increase the area over which it is possible to obtain a film of uniform character and thickness, which cannot be done using a CVD method.

Accordingly, the invention enables the formation of a carbonaceous hard film having a high hardness, strong adherence to the substrate, a wide range of substrate selections, and structural stability, which can be formed at room temperature and may have a larger area, the formation of this type of film having been difficult to achieve using any of the conventional methods for forming a hard carbonaceous film.

Although the present invention has been shown and described with respect to several preferred embodiments thereof, various changes, omissions and additions to the form and detail thereof, may be made therein, without departing from the spirit and scope of the invention.

What is claimed is:

1. A method of vapor phase formation of a carbonaceous hard film on a substrate material under reduced pressure, comprising:

depositing a vapor of a hydrogen free carbonaceous material on a substrate to form a covering layer;

ionizing gas clusters of aggregates of atoms or molecules of a material, which is gaseous at ambient temperature and pressure; and irradiating said covering layer with said ionized gas clusters while said covering layer is being deposited to form said carbonaceous hard film, wherein the Vickers hardness of said carbonaceous hard film is greater than approximately 3000 kg/mm$^2$.

2. The method of claim 1, wherein said vapor of a hydrogen free carbonaceous material is non-ionized.

3. The method of claim 1, wherein said vapor of a hydrogen free carbonaceous material is at least partially ionized.

4. The method of claim 1, wherein said hydrogen free carbonaceous material comprises one or more of a fullerene, a carbon nanotube, graphite, amorphous carbon, or a carbene.

5. The method of claim 4, wherein the depositing step and the irradiation step are performed using a ratio of approximately 1 to 10 ionized gas clusters per approximately 1 to 5000 molecules of the hydrogen free carbonaceous material.

6. The method of claim 5, wherein the ionized gas clusters comprise argon and the hydrogen free carbonaceous material comprises a fullerene.

7. The method of claim 1, wherein the atoms or molecules of said gas cluster comprise one or more of a rare gas, oxygen, a carbon oxide, nitrogen, a nitride, a halogen, or a halide.

8. The method of claim 1, wherein the Vickers hardness of said carbonaceous hard film is approximately 4,000 kg/mm$^2$ and the coefficient of friction is approximately 0.15.

9. The method of claim 1, wherein the Vickers hardness of said carbonaceous hard film is greater than approximately 4000 kg/mm$^2$ and the coefficient of friction is less than approximately 0.15.

10. The method of claim 1, wherein said carbonaceous hard film does not contain hydrogen.

11. The method of claim 1, wherein the ionized gas clusters have an ion accelerating energy ranging from approximately 3 keV to approximately 9 keV.

12. The method of claim 11, wherein the ion accelerating energy is approximately 7 keV.

* * * * *